(12) United States Patent
Mao et al.

(10) Patent No.: US 10,247,935 B2
(45) Date of Patent: Apr. 2, 2019

(54) MICROLED WITH INTEGRATED CONTROLLABLE BEAM STEERING AND/OR SHAPING

(71) Applicant: ABL IP HOLDING LLC, Conyers, GA (US)

(72) Inventors: An Mao, Reston, VA (US); Guan-Bo Lin, Reston, VA (US); Jack C. Rains, Jr., Herndon, VA (US); David P. Ramer, Reston, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 138 days.

(21) Appl. No.: 15/203,060

(22) Filed: Jul. 6, 2016

(65) Prior Publication Data

US 2018/0011310 A1 Jan. 11, 2018

(51) Int. Cl.

| G02B 26/00 | (2006.01) |
|---|---|
| G02B 26/08 | (2006.01) |
| G02F 1/29 | (2006.01) |
| G02B 3/14 | (2006.01) |

(52) U.S. Cl.
CPC ............ *G02B 26/005* (2013.01); *G02B 3/14* (2013.01)

(58) Field of Classification Search
CPC ........ G02B 26/123; G02B 2006/12107; G02B 27/283; G02B 5/3083; G02B 19/0061; G02B 2006/12102; G02B 27/1013; G02B 27/1086; G02B 27/4244; G02B 5/1809; G02B 5/204; G02B 6/13; G02B 6/131; G02B 6/138; G02B 6/262; G02B 6/4203; G02B 7/025

USPC ........ 359/237, 265–267, 290–292, 295, 298, 359/315, 321
See application file for complete search history.

(56) References Cited

U.S. PATENT DOCUMENTS

| 5,485,317 A | 1/1996 | Perissinotto et al. |
|---|---|---|
| 5,757,557 A | 5/1998 | Medvedev et al. |
| 6,095,668 A | 8/2000 | Rykowski et al. |
| 7,230,771 B2 | 6/2007 | Kuiper et al. |
| 7,382,544 B2 | 6/2008 | Cernasov |
| 7,413,306 B2 | 8/2008 | Campbell |
| 7,436,598 B2 | 10/2008 | Kuiper et al. |
| 7,569,867 B2 | 8/2009 | Shimonishi |
| 7,616,881 B2 | 11/2009 | Liang et al. |

(Continued)

OTHER PUBLICATIONS

Non Final Office Action for U.S. Appl. No. 15/188,195, dated Dec. 14, 2017, 13 pages.

(Continued)

Primary Examiner — Brandi Thomas
(74) Attorney, Agent, or Firm — RatnerPrestia

(57) ABSTRACT

The disclosed examples relate to various implementations of a micro-light emitting diode upon which is built a controllable variable optic to provide a chip-scale light emitting device. An example of the controllable variable optic described herein is a controllable electrowetting structure having a leak-proof sealed cell with a first fluid having a first index of refraction and a second fluid having a second index of refraction. The controllable electrowetting structure may be integrally formed on or in a substrate or semiconductor material associated with the micro-light emitting diode in alignment with one or more of the light emitting diodes of the micro-LED device to provide a controllable lighting distribution.

15 Claims, 10 Drawing Sheets

(56) References Cited

U.S. PATENT DOCUMENTS

| | | | |
|---|---|---|---|
| 7,697,187 B2 | 4/2010 | Kato et al. | |
| 8,231,249 B2 | 7/2012 | Tsuboi et al. | |
| 8,373,931 B2 | 2/2013 | Yamazaki et al. | |
| 8,508,436 B2 | 8/2013 | Jessop | |
| 8,564,884 B2 | 10/2013 | Hirsa et al. | |
| 8,649,102 B2 | 2/2014 | Berge et al. | |
| 9,188,774 B2 | 11/2015 | Jung et al. | |
| 9,488,758 B2 | 11/2016 | Hirsa | |
| 2006/0079728 A1* | 4/2006 | Kuiper | A61B 1/0019 600/9 |
| 2009/0165876 A1* | 7/2009 | Atkin | B01L 3/502723 137/825 |
| 2015/0349488 A1* | 12/2015 | Kimura | H01S 5/02252 359/641 |
| 2016/0293815 A1* | 10/2016 | Choi | H01L 33/60 |
| 2017/0363859 A1 | 12/2017 | Ramer et al. | |

OTHER PUBLICATIONS

Notice of Allowance for U.S. Appl. No. 15/188,232, dated Jan. 13, 2018, 18 pages.

N. Kumari et al., "Electrical actuation of electrically conducting and insulating droplets using ac and dc voltages", Purdue University Purdue e-Pubs, Birck and NCN Publications, Oct. 1, 2008, J. Micromech. Microeng. 18 (2008) 105015 (10pp), Journal of Micromechanics and Microengineering.

F. Mugele et al., "Tropical View Electrowetting: from basics to applications", Institute of Physics Publishing, J. Physc.: Matter 17 (2005) R705-R774, Journal of Physics: Condensed Matter (70pp).

Notice of Allowance for U.S. Appl. No. 15/188,195, dated May 24, 2018, 23 pages.

\* cited by examiner

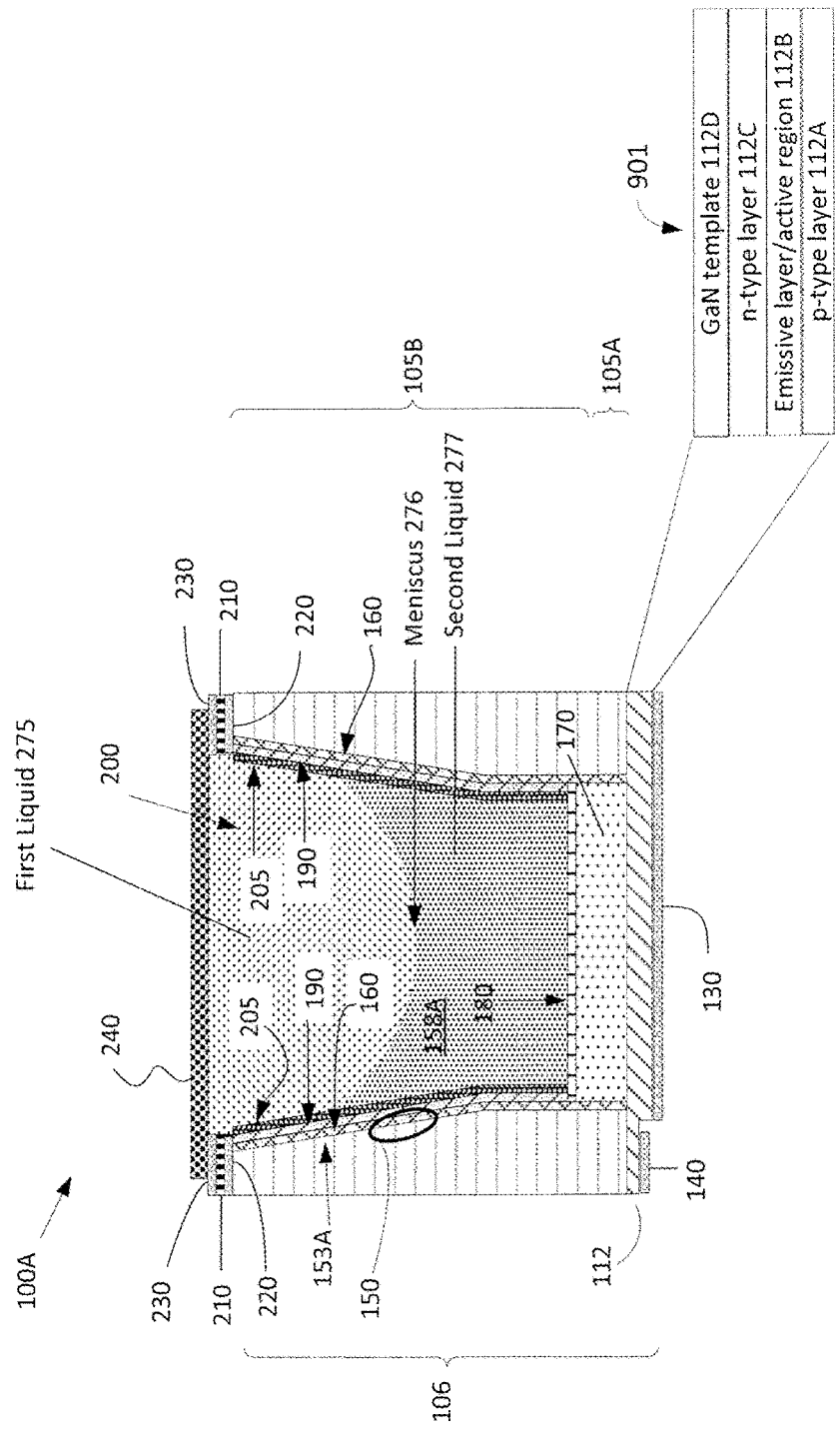

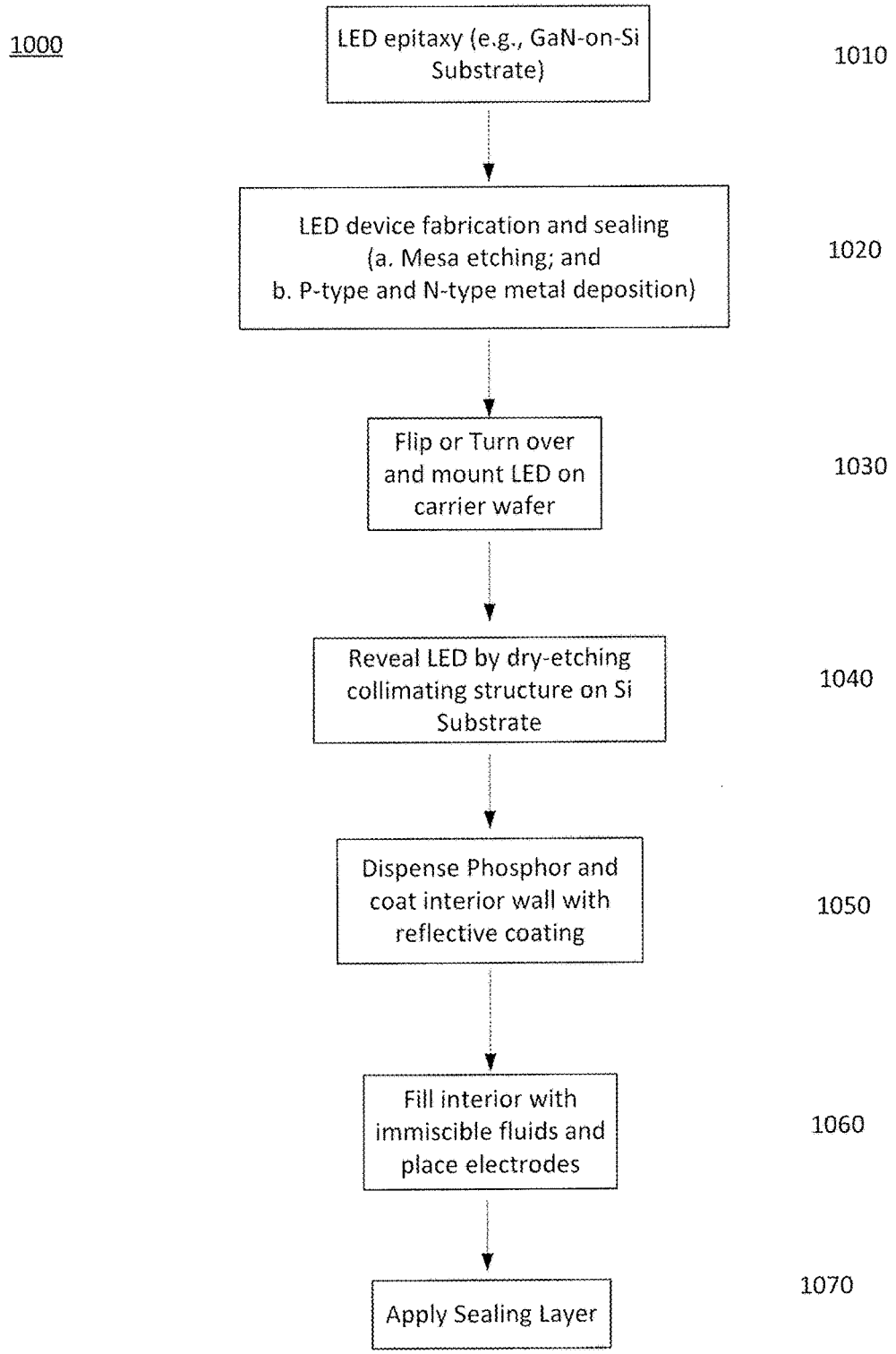

MICROLED WITH INTEGRATED CONTROLLABLE BEAM STEERING AND/OR SHAPING

TECHNICAL FIELD

The disclosed subject matter relates to lighting devices, and to configurations and/or operations thereof, that utilize micro-light emitting diode (microLED) light sources with an integrated controllable variable optic. The examples utilize controllable electrowetting optics incorporated on or in the same semiconductor substrate structure as the microLED for spatial modulation of light emitted from the microLED light source.

BACKGROUND

Light emitting diode (LED) lighting devices are commonly deployed as general illumination devices, for example, in homes, buildings of commercial and other enterprise establishments, as well as in various outdoor settings. LEDs are also being applied in other applications, such as variable beam width flash photography, lighting for photography, display technologies and the like.

The trend for semiconductor devices is to become smaller, more miniaturized, while maintaining substantially similar performance as previous generation devices. Since LEDs are semiconductor devices, LEDs have also become miniaturized, hence the advent of chip-scale packages that contain light emitting semiconductor devices, referred to as "microLEDs." The term "microLEDs" as used herein usually refers to LEDs with dimensions measured in microns. A chip scale package may have an area of no more than 120% of the area of the original die size and is a direct surface mountable device. The microLEDs chip-scale packages may be microscopic light emitting diodes that are formed using various semiconductor fabrication methods, such as a Gallium Nitride (GaN) with sapphire fabrication, wafer level fabrication or other fabrication techniques. The size and fabrication techniques of microLEDs differentiate them from prior generation LEDs. Some advantages of microLEDs over prior generation LEDs include higher light extraction efficiency, higher surface-to-volume ratio to dissipate heat more effectively, and more flexibility to be arranged in optical design due to its truly-point-source-like uniqueness. For example, not only have mircoLEDs found use in general illumination but also use in mobile device displays and camera flash devices. One method for maintaining the lighting performance of the microLEDs has been to incorporate integrated optics (e.g., chip-scale optics) over the output of the microLEDs to manipulate emitted light at the chip-scale level. While the integrated static optics may improve lighting performance of the microLED, the optical distribution of the light output by the microLED device, however, is fixed. The chip-scale static optics do not enable any variation in the beam shape or beam direction of the light output from the microLED chip scale device.

Hence, there is room for further improvement by providing chip-level spatial modulation capabilities of lighting devices that utilize microLEDs.

SUMMARY

Disclosed is an example of a chip-scale device including a light emitting semiconductor, a collimating beam structure and an electrowetting structure. The light emitting semiconductor that emits light, the light emitting semiconductor being formed on a substrate. The collimating beam structure is formed integrally on or in the first substrate. The collimating beam structure may be coupled to the light emitting semiconductor, and may be configured to collimate a beam of light emitted by the light emitting semiconductor. The electrowetting structure is etched from the substrate and coupled over the collimating beam structure. The electrowetting structure includes (a) a first fluid having a first index of refraction and that is electrically conductive; (b) a second fluid having an index of refraction greater than the first index of refraction of the first fluid; (c) a sealing layer that seals the first fluid and the second fluid within the electrowetting structure, wherein light emitted from the light emitting semiconductor passes through the collimating beam structure and the electrowetting structure; and (d) electrodes coupled to the first liquid and coupled to a voltage source.

In another example, a light emitting array is disclosed that includes a plurality of chip-scale light source devices arranged in a group. Each of the plurality of chip-scale light source devices in the group includes a lighting emitting semiconductor, a collimating beam structure and an individually, controllable electrowetting structure. The lighting emitting semiconductor, collimating beam structure and controllable electrowetting structure in each light source device are centered about a central axis of the light source device. Each light emitting semiconductor is formed on a substrate. Each collimating beam structure may be configured to collimate a beam of light emitted by a corresponding one of the plurality of light emitting semiconductors. Each electrowetting structure may be configured to vary light emitted by an light emitting semiconductor aligned with the electrowetting structure.

Disclosed in yet another example is a chip-scale light emitting device. The chip-scale light emitting device includes a chip-scale light emitting semiconductor and a chip-scale controllable electrowetting structure. The chip-scale light emitting semiconductor is built from a substrate that has a light emitting active region that emits light in a first direction through a light emission surface. The chip-scale controllable electrowetting structure is within an interior of exterior walls etched from the substrate, and arranged over the light emission surface to receive light output by the chip-scale light emitting semiconductor. The controllable electrowetting structure includes a first fluid and electrodes. The first fluid has a first index of refraction and a second fluid having a second index of refraction within the interior space of the exterior walls, the first and second fluids are immiscible, and the first fluid is conductive. The electrodes are positioned about the sealed cell coupled to the first fluid and to an electrowetting control voltage source. The first fluid is responsive to an electrowetting signal applied to the electrodes.

Another example is directed to a lighting system that includes a control interface, a chip-scale light source, and an individually, controllable chip-scale electrowetting structure. The control interface may be configured to receive light emission control signals from a controller, generate light generation signals in response to the received light emission control signals receive electrowetting control signals from the controller, and generate electrowetting signals in response to the received electrowetting control signals. The chip-scale light source may be coupled to the control interface that emits light in response to receiving the light generation signals from the control interface, wherein the emitted light may be output in a first direction. The individually, controllable chip-scale electrowetting structure may be coupled to the control interface and integrally formed on the chip-scale light source. The chip-scale electrowetting structure is configured to spatially modulate the inputted light according to the generated electrowetting signals, over a selected light output distribution.

BRIEF DESCRIPTION OF THE DRAWINGS

The drawing figures depict one or more implementations in accord with the present concepts, by way of example only, not by way of limitations. In the figures, like reference numerals refer to the same or similar elements.

FIG. 1B is a cross-sectional view of another example of a light emitting device incorporating a variable optic assembly.

FIG. 1C illustrates an example process for fabricating a light emitting device, such as the example light emitting device of FIG. 1B.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein relate to chip-scale semiconductor light emitting devices such as a microLED integrated with a chip-scale controllable electrowetting structure coupled to the output of the microLED. The controllable electrowetting cell may be a variable optic that enables the microLED to output light with a variable spatial distribution.

Disclosed examples include both a chip-level light emitting semiconductor and a chip-level, electrowetting. In some examples, a light emitting device is a chip-level light emitting semiconductor having a chip-scale light emitting structure as well as controllable chip-scale electrowetting structure at the semiconductor level. In some examples, the light source has a substrate structure configured to provide an electrowetting structure that contains fluids having different indices of refraction, and one of the fluids being conductive. The respective fluids respond to control signals that cause the fluids to change positions within the electrowetting structure. As a result, the device provides a chip-level light source that emits light having a controllable light beam output shape and direction.

Figure 1A:
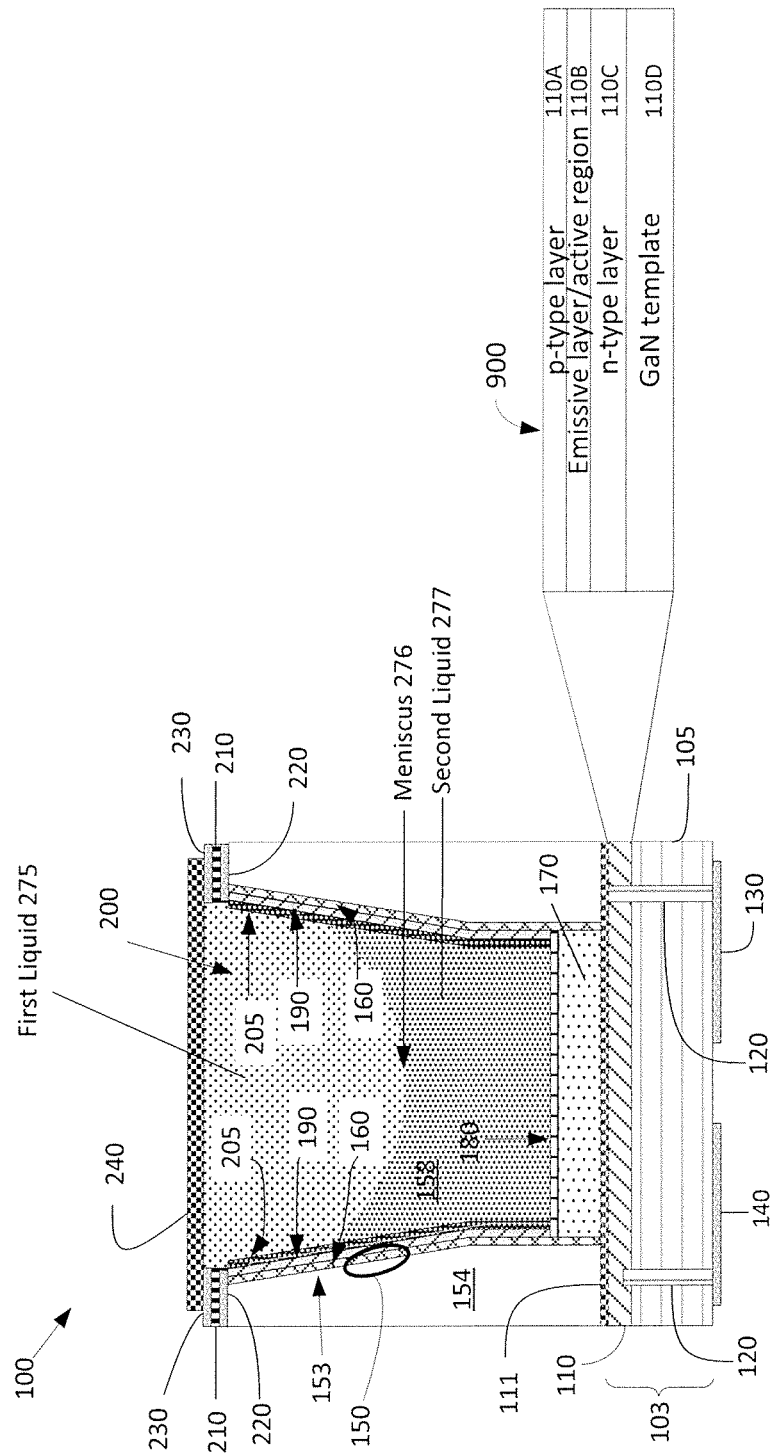
FIG. 1A is a cross-sectional view of an example of a light emitting device incorporating a variable optic assembly.

Reference is now made in detail to the examples illustrated in the accompanying drawings and discussed below. FIG. 1A is a cross-sectional view of an example of a lighting device 100 incorporating a variable optic assembly, e.g. at the chip-level. The lighting device 100, for example, includes: a chip-scale light source device 103, a collimating beam structure 150 and an electrowetting structure 200. The chip-scale light source device 103 includes a first substrate 105 and a light emitting semiconductor 110. The light emitting semiconductor 110, which emits light, may be formed on or from a first substrate 105. Typical examples of light emitting semiconductors 110 are types of light emitting diodes (LED), such as micro-LEDs. The first substrate 105 includes, in some examples, a via, such as the two or more vias 120, an anode electrode pad 130, and a cathode electrode pad 140. The two or more vias 120 form an electrical pathway between the anode electrode pad 130 and the cathode electrode pad 140 to the light emitting semiconductor 110 thereby enabling electrical connections. The light emitting semiconductor 110 (e.g., a light emitting diode (LED)) may be formed from epitaxial layers such as a p-type layer 110A, an emissive layer/active region 110B, an n-type layer 110C and a template 110D, such as a Gallium Nitride (GaN) template. A template is another substrate (different from 105) made from engineered materials or is a composite, that has one or more layers added to the original substrate. The emissive layer/active region 110B may emit light in a first direction through a light emission surface 900, such as the surface of the p-type layer 110A that is closest to phosphor 170. Of course, other epitaxial configurations may also be used to provide the light emitting semiconductor 110.

Disposed upon the first substrate 105 and positioned above the light emitting semiconductor 110 is a second substrate 154. In this example, the second substrate 154 is different from the first substrate 105, but may be made of the same material as the first substrate 105. The second substrate 154 may be hollowed out, for example, by etching or drilling, to form an interior space 158 that is within, or bounded by, walls 153 of substrate 154. A collimating beam structure 150, which will be described in more detail below, is formed from the walls 153 and a reflective material 160. The interior space 158 may extend vertically through the entire length of the collimating beam structure 150 (forming a hollow cylinder), or may only extend partially into the collimating beam structure 150 (forming a cup with an enclosed end). If, for example, the interior space 158 is cup-shaped (not shown), the substrate 154 from which the interior 158 is formed is transparent to enable light to enter the interior space 158 of the collimating beam structure 150 from the bottom-surface.

In the example of FIG. 1A, the walls 153 of the second substrate 154 are used to form the collimating beam structure 150. The walls 153 within the interior space 158 provide the shape of the collimating beam structure 150 that may have a reflective material 160 applied using one or more processes, techniques or methods. The reflective material 160 in combination with the shape of the interior surface of walls 153 enable collimation of light input into the collimating beam structure 150 from the light emitting semiconductor 110. The interior 158 may contain additional elements, such as a phosphor 170, a transparent protective layer 180, and an electrode layer 190. The interior space 158 of other examples of the substrate 154 may include all, less than all or more than all of the elements shown in the example of FIG. 1A.

The substrate 154 including the collimating beam structure 150 may be coupled to the chip-scale light emitting semiconductor 110 and aligned with the light emitting semiconductor 110 to collimate light emitted by the light emitting semiconductor 110. The color of the emitted light may be set, for example, using conventional chemical additives. For example, the bottom of collimating beam structure 150 closest to the chip-scale light emitting semiconductor 110 may be filled with a phosphor 170 that provides color attributes to the light emitted by the light emitting semiconductor 110. Over the phosphor 170 may be a transparent semiconductor material, such as indium gallium zinc oxide, or indium tin oxide (ITO) that acts as a transparent protective layer 180 providing chemical and/or thermal protection to the phosphor 170, components or materials within or beneath the interior space of the collimating beam structure 150.

To aid in collimating of the light output from the collimating beam structure 150, the reflective material 160, such as silver, gold or aluminum, is positioned on the surface of the interior walls 153 of the second substrate 154 to form the collimating beam structure 150 and between the electrowetting structure 200. The reflective material 160 may be inserted along a surface 161 of the interior space 158 to facilitate collimation by the collimating beam structure's 150 of the light output by the light emitting semiconductor 110. For example, silver, gold or aluminum may provide about 85%-95% reflectivity by using application methods such as sputtering or evaporation. In additional, metallic reflectors can also cooperate with titanium dioxide (TiO2)/silicon dioxide (SiO2) pairs in a distributed Bragg reflector (DBR) to form a hybrid DBR for close to 100% reflectivity (i.e., greater than the 95% reflectivity provided by the metallic reflector alone).

Some of the light emitted from the chip-scale light emitting semiconductor 110 excites the phosphor 170, and the excited phosphor 170 converts optical energy in one wavelength range (the excitation band of the phosphor 170) to another wavelength range. For example, the phosphor 170 may convert some energy from the light emitting semiconductor 110 from a less desirable wavelength range (e.g. near or outside the visible spectrum) to a more desirable wavelength range (e.g. to fill-in a gap in the spectral characteristic of light produced by the emitter), to improve efficiency of the lighting device 100 and/or to improve the quality of the light output. For example, the phosphor 170 may enable the lighting device 100 to provide a white light that is more suitable for general illumination than just the light emitted directly from the light emitting semiconductor 110. The phosphor 170 may include one type of phosphor or a number of types of phosphor, depending on the desired characteristics of the light output from the lighting device 100. Other types of lumiphors may be used with or in place of the phosphor 170.

In order to provide variable beam shaping and/or beam steering that is controllable, an chip-scale electrowetting structure 200 is provided over the chip-scale light emitting semiconductor 110 within the interior space 158 of the substrate 154 in which is formed the collimating beam structure 150. The elements of the chip-scale electrowetting structure 200 may be built up within the interior space of the collimating beam structure 150 by utilizing the walls 153 that are fluidically leak-proof for containing the electrowetting liquids 275 and 277, when sealed on the bottom and top. For example, the electrowetting structure 200 may be inserted into an interior space of the collimating beam structure 150.

Instead of building up the elements of the electrowetting structure 200 within the collimating beam structure 150, the electrowetting structure 200 may be made from a different structure. So long as the light alignment between the chip-scale light emitting semiconductor 110 and the electrowetting structure 200, and the bonding between the collimating beam structure 150 are compatible and do not affect alignment. In an alternate example, a pre-constructed electrowetting structure 200 may be inserted in the interior 158 of the substrate 154 in the collimating beam structure 150 is formed.

The electrowetting structure 200 is a controllable optical element that changes optical properties in response to an applied signal. In the examples of FIGS. 1A and 1B, the chip-scale electrowetting structure 200 includes, for example, a dielectric layer and hydrophobic layer 205, an isolation layer 210, an electrode pad 220, a ground electrode 230, and a sealing layer 240, such a glass substrate or the like.

The chip-scale electrowetting structure 200 may include a first fluid (or liquid) 275, a second fluid (or liquid) 277, and a sealing layer 240 that seals the first fluid 275 and the second fluid 277 within the electrowetting structure 200. Note that the terms "liquid" and "fluid" as referred to herein are used interchangeably. The first fluid 275 may be an electrically conductive liquid, such as water, and the second fluid 277 may be an oil or other similar fluid. An oil may be, for example, a silicon-based oil or the like. Since the two liquids may be water and oil, the first liquid 275 and the second liquid 277 are immiscible. In addition, the first fluid 275 may have a first index of refraction. The second fluid 277 also has an index of refraction (i.e., a second index of refraction) that is greater than the first index of refraction of the first fluid 275. For example, the first index of refraction may be referred to as "low," and the second index of refraction may be referred to as "high."

Light emitted from the light emitting semiconductor 110 passes through the collimating beam structure 150 and the electrowetting structure 200. The electrowetting structure 200 includes electrodes 220 that are connected to the electrodes 190 that are coupled to the first liquid 275 and a variable voltage/current source (shown in other examples, but not this example). The electrodes 220 and 190 that are coupled to the variable voltage/current source are configured within the electrowetting structure 200 to enable control of the geometry of a meniscus (i.e., a liquid interface) 276 between the first 275 and second 277 fluids in response to a control signal applied by the voltage/current source.

For example, in response to a voltage applied to individual electrodes in the layer of electrodes 190, the first fluid 275 may displace the second fluid 277 within the sealed electrowetting structure 200. The ground electrodes 230, the first fluid 275 (i.e., water) and the second fluid 277 (i.e. oil), dielectric layer 205 and electrode 220 form a capacitive circuit that is responsive to the applied voltage. For example, the applied voltage changes the surface tension between the conducting first liquid 275 and the hydrophobic/dielectric layer 205, which leads to the shape change of the conducting first liquid 275 and as a result, force the shape change of the insulating second liquid 277.

In the example of FIG. 1A as explained above, the collimating beam structure 150 may be etched from a substrate different from the first substrate 105. In an example regarding the structure of the light emitting device 100, the first substrate 105 and a second substrate in which the collimating beam structure 150 is formed are two separate pieces of substrate material. The two separate pieces of substrate material, such as wafers, may be bonded together to form a single substrate structure incorporating the light emitting semiconductor 110 and the collimating beam structure 150. For example, a transparent bonding material 111 may optionally be used to bond the separate pieces of substrate material. An electrowetting structure 200 that provides beam shaping and/or beam steering capability to the light emitting device 100 is incorporated into the bonded first and second substrates.

In another example as shown in FIG. 1B, a lighting device 100A is illustrated that has substantially the same structures, connections and configuration as those described with reference to FIG. 1A; therefore, a detailed discussion of the features of FIG. 1B will not be made. In the example of FIG. 1B, an integrated, single piece of substrate 106 may be processed, for example, by etching or some other process, to form the first substrate 105A portion and the second substrate 105B portion of substrate 106. For example, the light emitting semiconductor 112 emits light in a manner substantially the same as light emitting semiconductor 110, but with a different arrangement of layers 112A-112D (e.g., p-type layer 112A, emissive layer/active region 112B, n-type layer 112C, and GaN template 112D). The emissive layer/active region 112B may emit light in a first direction through a light emission surface 901, such as the surface of the GaN layer 112D closest to phosphor 170. In the example of FIG. 1B, the collimating beam structure 150 may be formed by etching the substrate 106 such that the collimating beam structure 150 is an integral part of the light source device 103. For example, the light emitting semiconductor 112 is built via an epitaxial process on or in a first portion 105A of the substrate 106 and the collimating beam structure 150 is formed from a second portion 105B of the substrate 106. Hence, the first portion 105A of the substrate 106 bears the light emitting semiconductor 112. The emissive layer/active region 112B may emit light in a first direction through a light emission surface, such as the surface of the GaN template 112D closest to phosphor 170.

In the example of FIG. 1B, the walls 153A of the second substrate portion 105B are used to form the collimating beam structure 150. The walls 153A within the interior space 158A provide the shape of the collimating beam structure 150 that includes a reflective material 160 that may applied using one or more processes, techniques or methods. The reflective material 160 in combination with the shape of the interior surface of walls 153A enable collimation of light input into the collimating beam structure 150 from the light emitting semiconductor 112. The interior 158A may contain additional elements, such as a phosphor 170, a transparent protective layer 180, and an electrode layer 190. The interior space 158A of other examples of the second portion 105B of substrate 106 may include all, less than all or more than all of the elements 170, 180 and 190.

The collimating beam structure 150 formed within second portion 105B of substrate 106 is aligned with the light emitting semiconductor 112 to collimate light emitted by the light emitting semiconductor 112. The color of the light emitted by light emitting semiconductor 112 may be set, for example, using conventional chemical additives. For example, the bottom of collimating beam structure 150 closest to the chip-scale light emitting semiconductor 112 may be filled with a phosphor 170 that provides color attributes to the light emitted by the light emitting semiconductor 112. Over the phosphor 170 may be a transparent semiconductor material, such as indium gallium zinc oxide, or indium tin oxide (ITO) that acts as a transparent protective layer 180 providing chemical and/or thermal protection to the phosphor 170, components or materials within or beneath the interior space 158A of the collimating beam structure 150.

Electrical signals are provided to the electrowetting structure 200 via couplings made to an electrode pad 220 and a ground electrode 230. The electrode pad 220 and ground electrode 230 provide external connection, or coupling, points for a voltage/current source (not shown in this example) to apply a voltage/current to the electrode layer 190. An isolation layer 210 separates the ground electrode 230 from the electrode pad 220. The electrowetting structure 200 is sealed beneath a glass substrate 240. The electrode pad 220 and a ground electrode 230 may protrude from beneath the glass substrate 240 to facilitate contact with electrical pathways to the voltage/current source. The glass substrate 240 provides to the electrowetting structure 200 a layer of protection from physical damage or environmental damage (e.g. corrosive chemicals or the like). Optically, the glass substrate 240 is transparent and produces minimal diffraction of the light output from the electrowetting structure 200.

An example of a process flow chart for fabricating a lighting device such as light emitting device 101A as shown in FIG. 1B will be described with reference to FIG. 1C. The example process 1000 for fabricating a light emitting device as shown in FIG. 1B includes a number of semiconductor fabrication and handling process steps. The process 1000 may begin with a silicon (Si) substrate. However, other similar substrates may be used. At step 1010, fabrication of the light emitting diode (LED) begins by use of an epitaxial process using, for example, Gallium Nitride (GaN) on an end of the Si substrate. The fabrication of the LED is performed on a "top" side of the Si substrate. In building epitaxial layers, a GaN template may be deposited as a first layer, a second layer may be an n-doped GaN layer, a third layer may be an emissive layer or active region, a fourth layer may be a p-doped GaN layer, and a fifth layer is the remainder of the Si substrate. Upon completion of the epitaxial layer, the electrodes, such as 130 and 140 of FIG. 1B, are positioned in respective areas at step 1020.

At step 1020, the LED semiconductor device fabrication begins by etching a "mesa" to expose the n-doped GaN layer for placement of an n-type metal electrode, such as an n-type electrode. P-type and n-type metals are deposited at locations on the epitaxial layer to provide contacts to which power may be applied to the light emitting active regions in the LED epitaxy. The p-type and/or n-type metals may be reflective. A large portion of the Si substrate as compared to the LED epitaxy remains beneath the LED epitaxy.

At step 1030, the Si substrate is turned (or flipped) over and the LED epitaxy is temporarily mounted to a carrier substrate. The temporary carrier substrate enables handling and moving of the Si substrate during fabrication of the integrated controllable variable optic structure. In this "turned over" or "flipped over" orientation, a substantial portion of the Si substrate is now located at the "top"

position. In this orientation, the first layer is the Si substrate, the second layer is the GaN template, the third layer is the n-doped GaN layer, the fourth layer is emissive region or active region, and the fifth layer is the p-doped GaN layer. Below the fifth layer are the p- and n-type electrodes and the carrier substrate.

With the Si substrate turned over, formation of the collimating beam structure may begin. At step 1040, etching, such as dry etching or the like, of the Si substrate is performed until the GaN template of the LED is revealed, which creates the walls and interior of the collimating beam structure.

After the etching has revealed the LED, a number of processes may be implemented collectively as step 1050. For example, at step 1050, phosphor may be dispensed over the revealed LED, and the walls of the collimating beam structure may have a reflective coating applied. With the phosphor in place and the reflective coating applied to the inner walls of the collimating beam structure, electrodes may also be deposited on the inner wall of the collimating beam structure at step 1050. In addition, the electrodes may be coated with a hydrophobic and isolation layer (i.e. a dielectric coating).

After the application of the phosphor and the deposition of the electrodes and hydrophobic and isolation layer, the remaining interior at step 1060 of the collimating beam structure may be filled with the first and second liquids with differing indices of refraction. In addition, at step 1060, control electrodes, which may be metal, and insulating material, such as 210-230, may be positioned at the top of the collimating beam structure. the electrode pad 220 and the ground electrode 230 are separated by the isolation layer 210.

At step 1070, a transparent sealing layer, such as 240, may be applied to the opening of the collimating beam structure to provide a leakproof sealed container in which is formed a controllable variable optic. The leakproof sealed container is formed by the collimating beam structure walls sealed on one end by the sealing layer and the phosphor on the other end of the leakproof container. The carrier substrate may also be removed at step 1070. The process 1000 provides a micro-LED with a controllable variable optic as shown in FIG. 1B. The process 1000 described in the foregoing paragraphs is but one example of a fabrication process for constructing a micro-LED with a controllable variable optic from a single substrate as such it is envisioned that other processes may be used to achieve a similar structure.

Figure 2A:
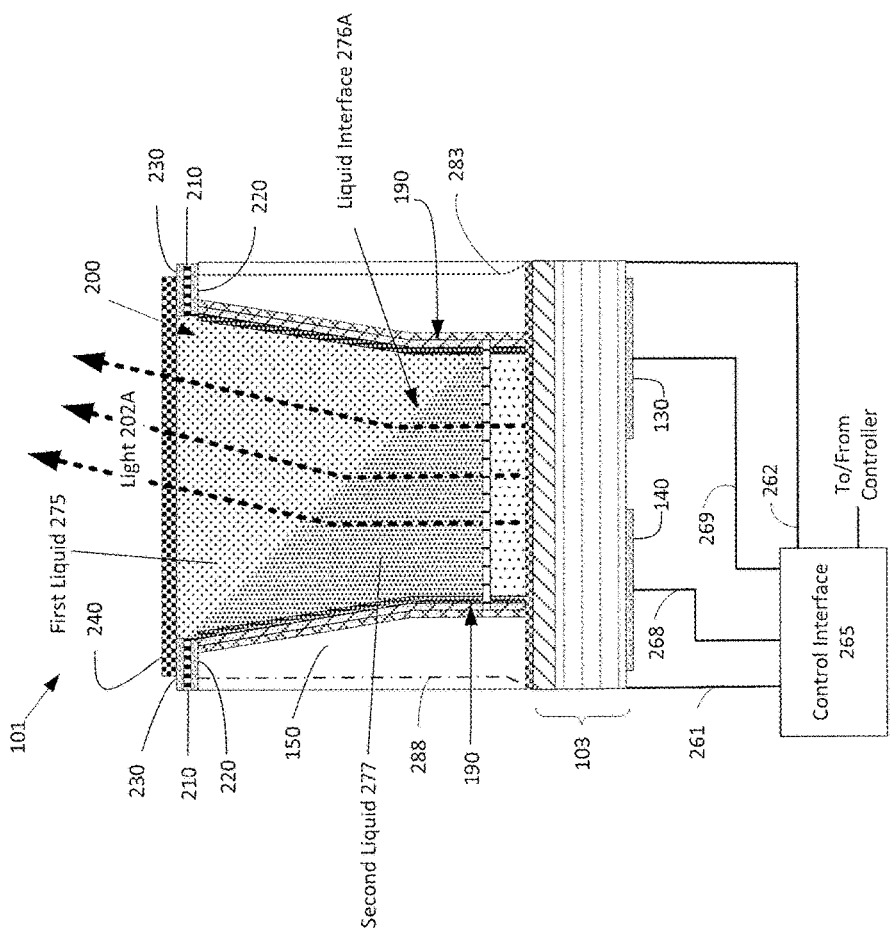
FIG. 2A is a cross-sectional view of a chip-scale light emitting device incorporating a variable optic assembly, such as that shown in FIG. 1A, in which the variable optic assembly is configured to provide an example of a spatial modulation distribution to the emitted light.
Figure 2B:
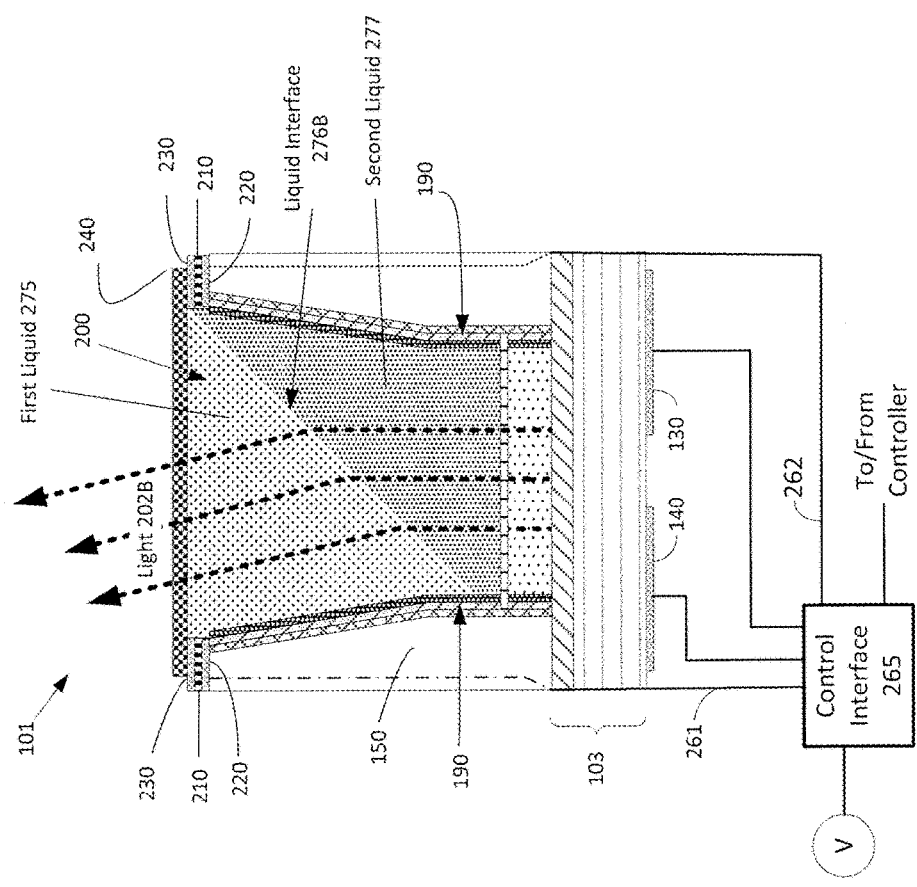
FIG. 2B is a cross-sectional view of a chip-scale variable optic light emitting device, such as that shown in FIG. 1A, in which the variable optic assembly is configured to provide another example of a spatial modulation distribution to the emitted light.

The foregoing description describes examples of the structure of the device 100 of FIG. 1A and device 100A of FIG. 1B, and an example process for fabricating the example structure of FIG. 1B was described with reference to FIG. 1C. Operation of the device 100A or 100B will be explained in more detail with reference to FIGS. 2A and 2B. The structure of device 101 in FIG. 2A is substantially the same as device 100. However, also included in the FIGS. 2A and 2B are a control interface 265, electrical pathways 283 and 288 associated with the device 101 and electrical connections 261, 262, 268 and 269. The control interface 265 may be configured to receive and/or send signals to a controller (not shown).

As will be described in more detail with reference to FIGS. 7A and 7B, the control interface 265 may include logic circuits and/or a microprocessor that enables the control interface 265 to control the intensity of the light emitted by light emitting device 103 as well as control spatial modulation of the emitted light by controlling a state of the electrowetting structure 200. The control interface 265 may act as a variable voltage/current source in response to signals received from the controller.

For example, a light emission control signal may be received by the control interface 265 from a controller. The light emission control signal indicating an intensity of light that is to be emitted by the light emitting device 103. Based on the received light emission control signal, the control interface 265 may output a voltage that is applied via the electrical connections 268 and 269 to the cathode electrode pad 140 and anode electrode pad 130.

As mentioned above with respect to FIG. 1A, the electrowetting structure 200 manipulates the distribution of light through the electrowetting structure 200 by controlling the geometry of meniscus 276 between the first liquid 275 and the first liquid 277. Returning to the example of FIG. 2A, the control interface 265 may also receive electrowetting control signals that indicate a desired state, or geometry of the electrowetting structure 200. In the example of FIG. 2A, the state of the electrowetting structure 200 is changed by application of a signal from the control interface 265.

The control interface 265 includes electrical connections 261 and 262 that couple to electrical pathways 283 and 288. The electrical pathways 283 and 288 may be formed in or on the substrate from which the collimating beam structure 150 is formed, and coupled to the electrode pad 220 or the ground electrode 230. As shown, the electrode pad 220 and the ground electrode 230 are separated by the isolation layer 210.

In the example shown in FIG. 2A, the control interface 265 has received a light emission control signal that caused the light emitting device 103 to emit light 202A. The emitted light 202A is output from the light emitting device 103 and is input into the electrowetting structure 200.

The control interface 265 has also received an electrowetting control signal indicating that the electrowetting structure is to apply a beam steering spatial modulation to the light input from the light emitting device 103. As a result of the received electrowetting control signal, the control interface 265 applies a voltage or current via the electrical connections 261 and 262 and the electrical pathways 283 and 288 over the electrode pads 220 and ground electrode 230. The applied voltage or current is also applied to the electrode 190, which is coupled to the electrically conductive first liquid 275. As a result to the applied voltage or current to the electrode 190, the first liquid 275 reacts and displaces the second liquid 277 within the electrowetting structure 200. As a result, the meniscus 276 assumes a position shown as liquid interface 276A. As a result of the liquid interface 276A, the light 202A is steered to the right of the light emitting device 101.

Conversely, the example of FIG. 2B shows lighting device 101 in which the electrowetting structure 200 has been signaled to place the liquid interface 276B into a position that causes the emitted light 202B to be steered to the left of the light emitting device 101.

While the examples of FIGS. 2A and 2B show only examples of beam steering, the light emitting devices 101 and 100 of FIG. 1A are also controllable to provide beam focusing. For example, the meniscus 276 of in FIG. 1A may produce a focused beam of light when a light emission control signal is applied to the light emitting device 103 and causing the emission of light. Alternatively, the meniscus 276 may be inverted resulting in the light input from the light emitting device 103 to be dispersed instead of focused.

The level of control of the spatial modulation of the inputted light may be nearly infinite in possible configurations based on the number of steps of control signals and/or the positioning of electrodes about the electrowetting structure 200.

The example of FIG. 1A shows a single light emitting device 100. However, the single light emitting device 100 may be grouped with other light source devices like 100 to provide an array of selectively variable optic light source devices as will be described with reference to FIG. 3.

Figure 3:
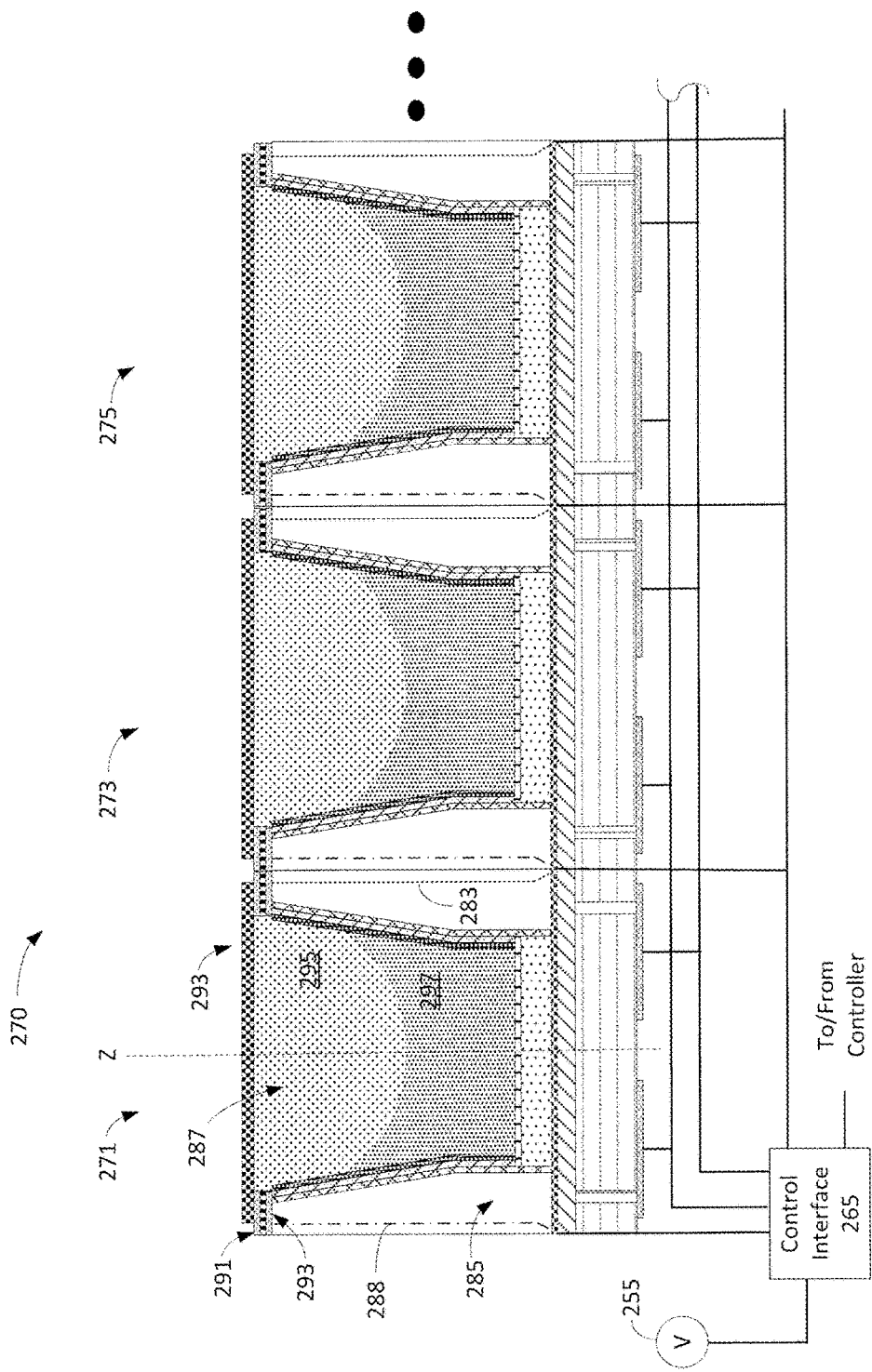
FIG. 3 is a cross-sectional view of several variable optic light emitting devices, similar to the one device shown in FIG. 1A, arranged in an array.

FIG. 3 is a cross-sectional view of variable optic light emitting devices, such as that shown in FIG. 1A, arranged in an array of variable optic light emitting devices. The lighting devices of FIG. 1A may be arranged to provide general illumination lighting having a variable intensity and controllable spatial modulation (e.g., beam steering and/or beam shaping). It is envisioned that an array as described in this example may be incorporated in a controllable luminaire that will be described in more detail with respect to the example of FIG. 5. For example, the controllable luminaire may provide a wall wash lighting distribution based on an input signal, and based on another input signal provide task lighting at a desktop. As shown in FIG. 2, a light emitting array 270 includes a number, such as two or more, of light emitting devices 271, 273 and 275. Although the array example of FIG. 3 only shows three light emitting devices 271, 273 and 275, it is envisioned that the array may contain tens, hundreds or thousands of light emitting devices.

The number of lighting devices 271, 273 and 275 are shown arranged in a group as a linear array 270. While the array 270 is shown as a linear array, the group may be any array shape such as circular, polygonal, linear or the like.

The individual lighting devices 271, 273 and 275 in the array 270 is similar to the individual light source device 100 of FIG. 1A. For example, each of the number of lighting devices 271, 273 and 275 in the group, or array, 270 includes a lighting emitting semiconductor 280, a collimating beam structure 285, and an individually, controllable electrowetting structure 287. Therefore, a detailed description of the individual light emitting devices will not be provided.

The lighting emitting semiconductor 280, collimating beam structures 285 and controllable electrowetting structure 287 of lighting device 271 are centered about a central axis Z. Each of the lighting devices 271, 273 may be configured as the light emitting device 100 of FIG. 1A. For example, each light emitting semiconductor 280 is formed on a first substrate, each collimating beam structure 285 is configured to collimate a beam of light emitted by a corresponding one, such as 280, of the number of light emitting semiconductors; and each electrowetting structure 287 is configured to vary light (as explained above with respect to FIG. 1A) emitted by the light emitting semiconductor 280 that is aligned along the central axis Z with the respective electrowetting structure 287.

With specific reference to lighting device 271, which is configured substantially identically to lighting devices 273 and 275 of array 270, each electrowetting structure, such as 287, is disposed over the collimating beam structure, such as 285 of the lighting device 271 of the array 270. Similar to the electrowetting structure of FIG. 1A, the individual electrowetting structure 287 example of FIG. 3 includes (a) a first fluid 295 having a first index of refraction and that is electrically conductive; (b) a second fluid 297 having an index of refraction greater than the first index of refraction of the first fluid; (c) a sealing layer 293 that seals the first fluid and the second fluid within the electrowetting structure; and (d) electrodes 291, 292 coupled to the first liquid and coupled to a control interface 265. In the example of FIG. 2, the first substrate (e.g. 280) of each light emitting semiconductor of the chip-scale lighting devices 271, 273 and 275 is shown separate from the first substrates of the other light emitting semiconductors of individual light emitting devices of the number of light emitting devices. In other words, the first substrate 280 of lighting device 271 may be separate from the first substrate of lighting device 273 or 275. The respective substrates may be coupled to one another by a bonding agent (not shown), such as an adhesive or the like.

Each of the electrowetting structures, such as 287, is separately controllable to provide a particular beam shape or beam pattern output from the array 270. The control interface 265 may include connections to the electrodes 293 and 291. The electrode 293 may be a control electrode to which is applied an electrowetting signal for controlling the state of the electrowetting structure 287, and the electrode 291 may be a ground, or reference voltage, electrode. While the respective electrodes 293 and 291 are shown on each side of the collimating beam structure 285. The electrodes 291 and 293 may, for example, completely surround the electrowetting structure or be spaced about the perimeter of the electrowetting structure 287. As shown in FIG. 3, electrode conductors, shown as small dashed lines and dash-dot-dash lines, that couple the electrodes 291 and 293 of the respective electrowetting structures to the control interface 265.

The light emitted from the light emitting semiconductor 280 is in response to a signal applied by voltage source V. The light emitting semiconductors of the respective devices 271, 273 and 275 are shown in the example of FIG. 3 connected in parallel. However, it is envisioned that the respective light emitting semiconductors 280 may be separately controlled, for example, via connection to separate voltage sources. The light emitted from the light emitting semiconductor 280 is output in a direction upward along the central axis Z toward the transparent sealing layer 293. The emitted light passes through the electrowetting structure 287 where the emitted light is shaped and or steered, and is output through the transparent sealing layer 293.

The control interface 265 may be coupled to a controller that provides control signals for controlling the light emitted by the respective chip-scale lighting devices 271, 273 and 275. The controller may also provide electrowetting signals to the control interface 265 that are provided to the electrowetting structures of the respective 271, 273 and 275. Alternatively, the control interface 265 may include a processor or logic. The processor or logic may interpret a signal received from a controller or other device, and cause the control interface 265 to deliver a control signal to the light emitting semiconductors and/or electrowetting signals to the respective light emitting devices 271, 273 and 275.

A controllable electrowetting optic including a collimating beam structure 285 and electrowetting structure 287 as shown the example of FIG. 3 are configured for use with the light emitting semiconductor 280. However, other microLED configurations that may be adapted to accept a variable optic at the microLED level are also envisioned.

Figure 4:
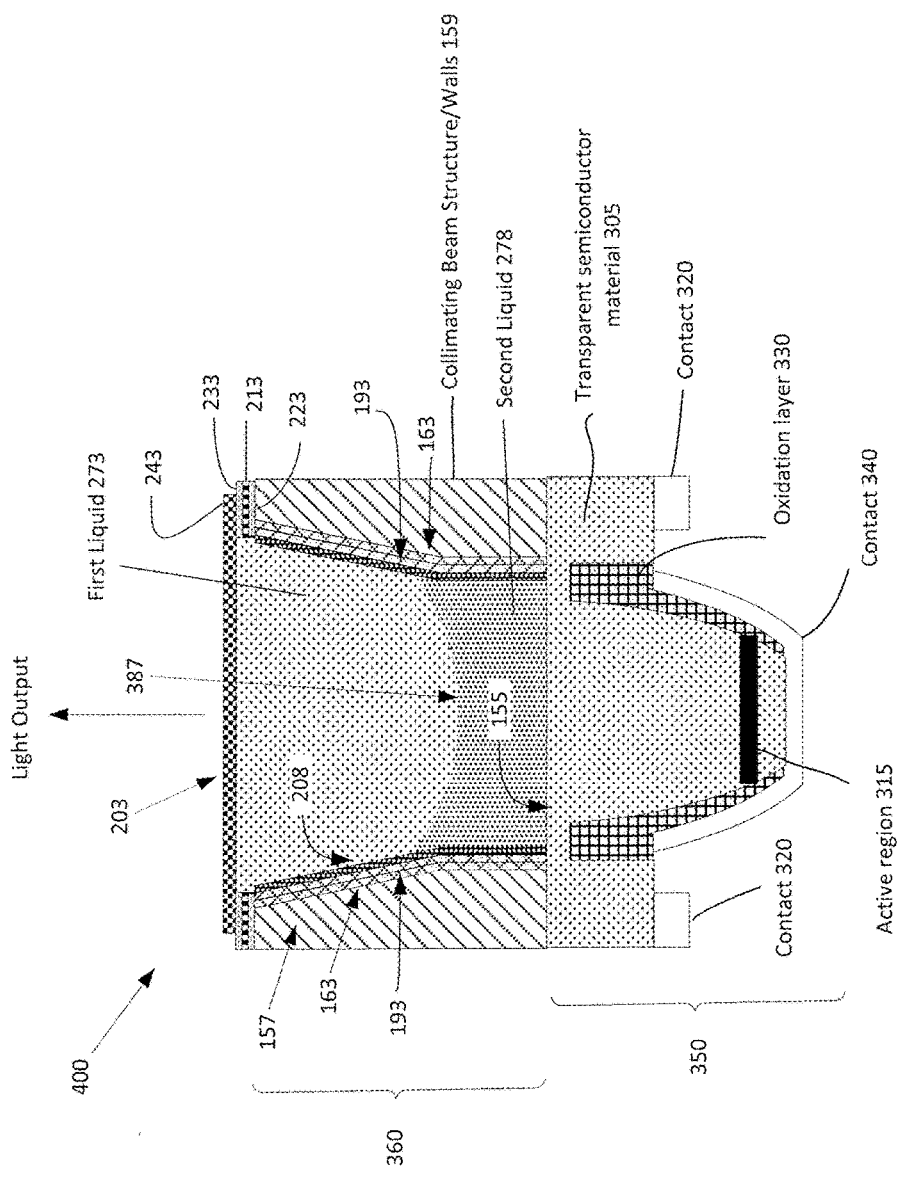
FIG. 4 is a cross-sectional view of another light emitting device example incorporating a variable optic assembly.

FIG. 4 is a cross-sectional view of another example of a light source incorporating a variable optic assembly.

The lighting device 400 includes a light emitting semiconductor 350 and a variable optic structure 360. The light emitting semiconductor 350 is configured to emit light in response to a signal applied across the contacts 320 (i.e., anode) and 340 (i.e., cathode). The variable optic structure 360 is configured to, in response to signals applied to electrode contacts 233 and 223, control the output distribution of the emitted light.

The light emitting semiconductor 350 includes a transparent semiconductor material 305, an oxidation layer 330, an active region 315, and contacts 320 and 340. The transparent semiconductor material 305 may be formed from Aluminum Gallium Indium Nitrate (AlGaInN), variations thereof, or the like. Built around the transparent semiconductor material 305 are an oxidation layer 330 and an active region 315. The oxidation layer 330 electrically insulates portions of the semiconductor material 305 and the active region 315 from the contact, or anode, 340. The contact 340 may be formed from a conductive and reflective material, such as aluminum (Al) or the like.

In an example, a signal from an electrical source, such as a voltage source (not shown in this example), is applied across the first contact 320, which may be an n-type metal contact (i.e. cathode), and the second contact 340 (i.e. anode), which may be a p-type metal contact with high reflectivity, that causes the active region 315 to emit light. Light emitted by the active region 315 passes through the transparent semiconductor material 305 toward the variable optic structure 360.

The variable optic structure 360 includes a collimating beam structure 159 and a electrowetting structure 203. The collimating beam structure 159 is positioned above the light emitting semiconductor 350 and collimates light emitted by the light emitting semiconductor 350 for output from the variable optic structure 360.

In an example, the collimating beam structure 159 may be formed by etching a substrate material such as silicon (Si). The collimating beam structure 159 may be coupled to the light emitting semiconductor 350, for example, by wafer bonding (bonding material not shown in this example). Wafer bonding is a general term for the process of joining together two wafers, either homogeneous wafers or heterogeneous wafers. For example, wafer bonding includes several different methods like direct bonding, frit glass bonding, glue bonding, or the like that may be used for coupling the collimating beam structure 159 with the light emitting semiconductor 350.

The collimating beam structure 159 includes an interior space, such as 158 of FIG. 1A, enclosed by one or more exterior walls 157. An interior space of the collimating beam structure 159 may contain additional elements, such as a hydrophobic and dielectric layer 208, an electrode layer 193, and a reflective material 163. The interior space of other examples of the collimating beam structure 159 may include all, less than all or more than all of the elements shown in the example of FIG. 4.

In another example, the chip-scale light source 350 may formed from a substrate. As part to the variable optic structure, 360 the substrate includes walls 159 that may be formed, for example, by etching, from the substrate from which the chip-scale light source 350 is formed. The walls 159 form an interior space within which the electrowetting structure is positioned. The substrate may be formed over the chip-scale light source in a direction of light output from the chip-scale light source, The color of the emitted light may be set using conventional chemical additives. For example, the bottom of collimating beam structure 159 closest to the light emitting semiconductor 350 may be filled with a phosphor (not shown in this example) that provides color attributes to the light emitted by the light emitting semiconductor 350. In addition or alternatively, a transparent semiconductor material (not shown), such as indium gallium zinc oxide, or indium tin oxide (ITO), may be applied at the interface 155 between the light emitting semiconductor 350 and the variable optic 360 to serve as a transparent protective layer 180 providing chemical and/or thermal protection to the phosphor, if present, and/or the transparent semiconductor material 305.

Other structural details of the variable optic structure 360, and, in particular, details of the electrowetting structure 203 are similar to those described above with reference to electrowetting structure 200 of FIG. 1A. For example, the controllable electrowetting structure 203 utilizes the walls 157 of the collimating beam structure 159 as leak-proof cell walls. The interface 155 between the collimating beam structure 157 and the transparent semiconductor material 305 of the light emitting device 350 is also leak-proof. Sealed within the electrowetting structure 203 are a first fluid 273 having a first index of refraction and that is electrically conductive; and a second fluid 278 having an index of refraction greater than the first index of refraction of the first fluid. The fluids, or liquids, 273 and 278 are immiscible. For example, one of the fluids may be water and the other fluid may be an oil. The controllable electrowetting structure also includes a sealing layer 243 that is transparent and seals the first fluid 273 and the second 278 fluid within the electrowetting structure 203; and electrodes 193 coupled to the first fluid and coupled to a voltage source (not shown in this example).

Operationally, the electrowetting structure 203 functions in a manner similar to the functioning of the electrowetting structure 200 as described above with reference to FIGS. 2A 2B and 3. As such, the variable optic structure 360 responds to electrowetting control signals to provide selected spatial modulation beam distributions, and light emitted from the light emitting device 350 passes through the electrowetting structure 203 and is output through the transparent sealing layer 243. The outputted light having a spatially modulated light distribution. For example, the light may be modified by the electrowetting structure, as explained above with reference to FIGS. 2A and 2B, to have a beam shape or beam direction as indicated by the electrowetting control signals.

At a high-level, a method of fabricating a lighting device, such as 400 may include a number of fabrication steps. An example of such a fabrication method of the light emitting semiconductor 350 includes the growth of gallium nitride (GaN)-based light emitting diode (LED) on a sapphire substrate to form a chip-scale, such as a microLED. Upon completion of the growing of the GaN-based microLED, the sapphire substrate lifted off of the LED. The microLED, i.e. 350, is mounted on silicon substrate from which the collimating beam structure 159 may be formed. The microLED may be fabricated on the epitaxy side of the silicon substrate, for example, by dry etching to form the dome shape in the transparent substrate 305, and generation of the oxidation layer 330, an n-metal contact, such as 320, and a p-metal contact such as 340. Upon completion of the etching, the microLED 350 is turned over. The interior of the collimating beam structure 159 is used in the fabrication of the electrowetting structure 203, which may be performed by dry etching and/or other processes. Known processes, such as deposition processes, may be used to build the structures of the electrowetting structure 203. For example, deposition processes may be used to apply the reflective coating 163, the electrodes 193 and the hydrophobic and insulation layer 208 to the interior of the collimating beam structure 159. Other components, such as the n-metal and/or p-metal electrodes 223, 233, isolation 213 and the like, may also be fabricated at this time. First liquid 273 and second liquid 275 may be added into the electrowetting structured 203, and sealed with the sealing layer 243. The sealing layer 243 is similar to the sealing layer 240 as described with reference to FIG. 1A. The foregoing described at a high level a GaN-on-sapphire technique for constructing the light source 400. However, other processes may be used for constructing the light source 400. For example, if a GaN-on-silicon fabrication technique is used, the above process would begin by growing of the GaN-based microLED directly on the silicon.

Figure 5:
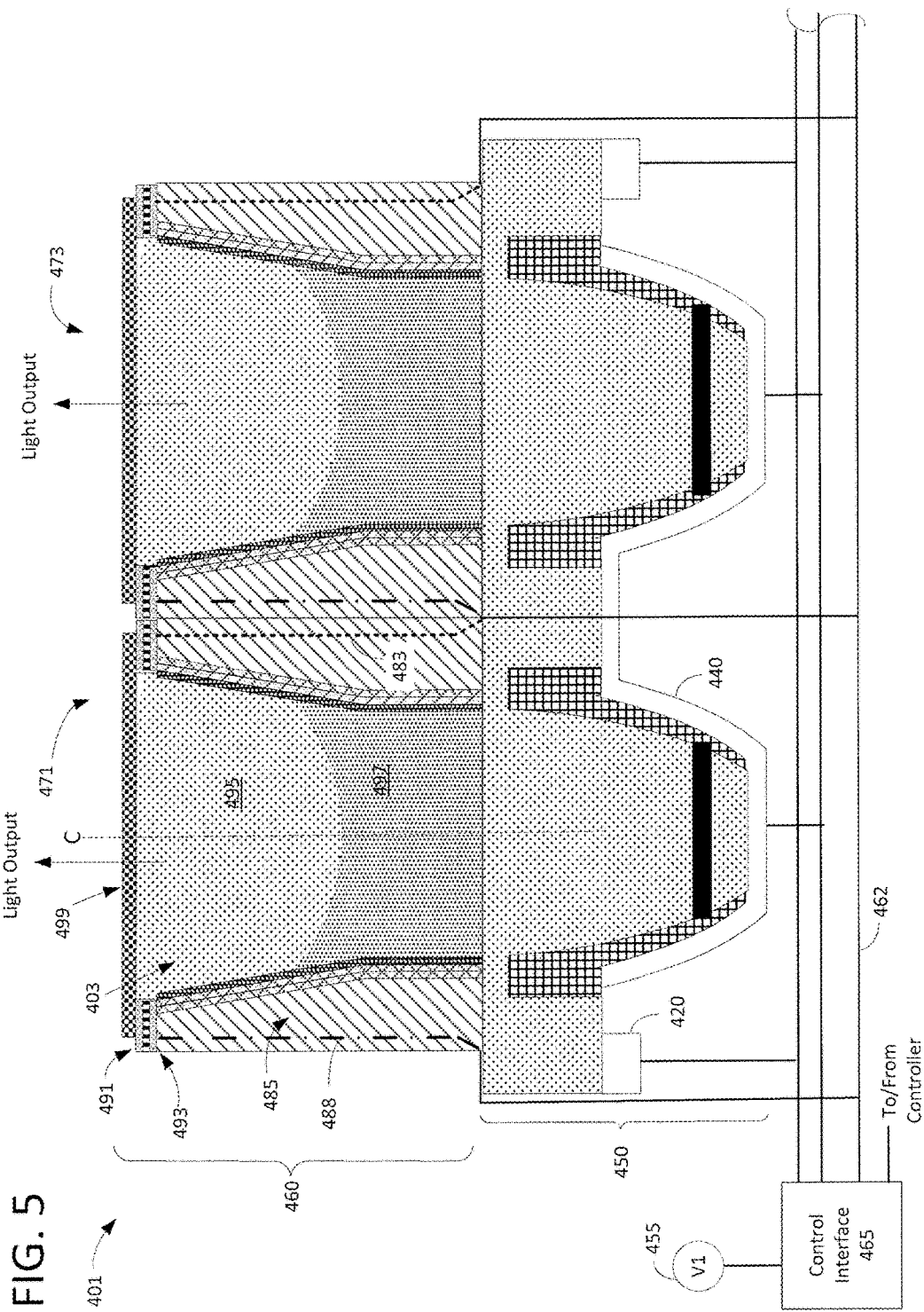
FIG. 5 is a cross-sectional view of two variable optic light emitting devices, similar to the one device shown in FIG. 4, arranged in an array of variable optic light emitting devices.

FIG. 5 is a cross-sectional view of variable optic light sources, such as that shown in FIG. 4, arranged in an array of variable optic light sources.

Although the array example of FIG. 5 only shows two lighting devices 471 and 473, it is envisioned that the array may contain tens, hundreds or thousands of light emitting devices. The number of lighting devices 471 and 473 are shown arranged in a group as a linear array 401. While the array 401 is shown as a linear array, the group may be any array shape such as circular, polygonal, linear or the like.

The individual lighting devices 471 and 473 in the array 401 are similar to the individual light source device 400 of FIG. 4. For example, each lighting device 471 and 473 of the number of lighting devices in the group, or array, 401 includes a lighting emitting semiconductor 450 and a variable optic structure 460. The variable optic structure 460 further includes a collimating beam structure 485, and an individually, controllable electrowetting structure 403 as discussed above with reference to FIG. 4.

In the example of FIG. 5, the lighting emitting semiconductor 450, collimating beam structures 485 and controllable electrowetting structure 403 of light emitting device 401 are centered about a central axis C. The respective materials from which are formed the lighting emitting semiconductor 450 and collimating beam structure 485 of the variable optic structure 460 may be coupled to one another by a bonding agent (not shown), such as an adhesive or the like.

Each of the lighting devices 471 and 473 may be configured similar to the lighting device 400 of FIG. 4. For example, light emitting semiconductor 450 of each of the lighting devices 471 and 473 is formed from a first substrate. In addition, each collimating beam structure 485 is configured to collimate a beam of light emitted by a corresponding one of the number of light emitting semiconductors, such as 450, from the respective lighting devices 471 and 473. Each electrowetting structure 403 is configured to vary light (in a manner similar to that explained above with respect to FIG. 4) emitted by the light emitting semiconductor 450. The emitted light output toward the electrowetting structure 403 along the central axis C with the respective electrowetting structure 403.

Lighting device 471 and lighting device 473 of array 401 are configured substantially identically; therefore, the following detailed discussion will refer primarily to lighting device 471 unless a distinction between the two light emitting devices requires separate reference. As shown in the illustration of lighting device 471, each electrowetting structure 403 is disposed over the collimating beam structure 485 in the array 401. Similar to the electrowetting structure 487 example of FIG. 4, the individual electrowetting structure 403 includes (a) a first fluid 495 having a first index of refraction and that is electrically conductive; (b) a second fluid 497 having an index of refraction greater than the first index of refraction of the first fluid; (c) a sealing layer 499 that seals the first fluid and the second fluid within the electrowetting structure; and (d) electrodes 491, 493 coupled to the first liquid and coupled via electrical pathways 483 and 488 to a control pathway of 462 that is coupled to a control interface 465. The walls 485 of the collimating beam structure that enclose the individual electrowetting structure 403 are leak proof and have layers (not labeled in this example) including a hydrophobic and dielectric layer, electrodes coupled to the electrodes 491 and 493, and a reflective layer, such as 160.

Each of the electrowetting structures, such as 403, is separately controllable to provide a particular beam shape or beam pattern output from the array 401. The control interface 465 may include connections to the electrodes 493 and 491. The electrode 493 may be a control electrode to which is applied an electrowetting signal for controlling the state of the electrowetting structure 401, and the electrode 491 may be a ground, or reference voltage, electrode. While the respective electrodes 493 and 491 are shown on each side of the collimating beam structure 485. The electrodes 491 and 493 may, for example, completely surround the electrowetting structure or be spaced about the perimeter of the electrowetting structure 403. As shown in FIG. 5, electrode conductors, shown as small dashed lines and dash-dot-dash lines, that couple the electrodes 491 and 493 of the respective electrowetting structures to the control interface 465.

The light emitted from the light emitting semiconductor 450 is emitted in response to a signal applied by voltage source 455. The light emitting semiconductors of the respective lighting devices 471, and 473 are shown in the example of FIG. 4 connected in parallel. However, it is envisioned that the respective light emitting semiconductors 450 may be separately controlled, for example, via connection to separate voltage sources. The light emitted from the light emitting semiconductor 450 is output in a direction upward along the central axis C toward the transparent sealing layer 499 (see arrows labeled Light Output). The emitted light passes through the electrowetting structure 287 which may shape (e.g., focus or spread) and/or steer (e.g., direct toward the left, right, forward or backward) the emitted light. The light is output through the transparent sealing layer 499.

The control interface 465 may be coupled to a controller (not shown in this example) that provides control signals (e.g., to the voltage source 455) for controlling the light emitted by the respective lighting devices 471, and 473. For example, the controller may provide a signal that the control interface 465 interpret as an indication that the light emitting semiconductor 450 is to emit light at a maximum output. In response to the signal received from the controller, the control interface 465 may apply a signal between contacts 420 and 440 causing the active region of the light emitting semiconductor 450 to emit the indicated maximum light output.

The controller may also provide electrowetting signals to the control interface 465 that are provided to the electrowetting structures of the respective lighting devices 471 and 473. Alternatively, the control interface 265 may include a processor or logic. The processor or logic may interpret a signal received from a controller or other device, and cause the control interface 265 to deliver a control signal to the light emitting semiconductors and/or electrowetting signals to the respective light emitting devices 471 and 473.

The first fluid 495 has a first index of refraction and is conductive, and the second fluid 497 has a second index of refraction. The first 495 and second 497 fluids are immiscible. For example, the first fluid may be water and the second fluid may be oil.

Electrodes 491 and 493 may be positioned about the sealed cell, and are coupled to the first fluid and to an electrowetting control voltage source. The first fluid is responsive to an electrowetting signal applied to the electrodes from the electrowetting control voltage source. For example, in response to the applied electrowetting signal, the first fluid and second fluid assume positions relative to one another in the electrowetting structure. The assumed positions provide a first optical state of the electrowetting structure that causes the light output from the electrowetting structure to assume a first output lighting distribution. The first output lighting distribution may be a focused beam of light directed substantially straight out of the electrowetting structure. Alternatively, the first lighting distribution may be beams of light steered toward the left or right of the center (e.g., central axis). Of course, other output lighting distributions may be provided depending upon the applied electrowetting signal. For example, in response to an electrowetting signal, the first and second fluids change positions within the electrowetting structure to provide a second optical state that provides a second output lighting distribution that is different from the first output lighting distribution.

Figure 6:
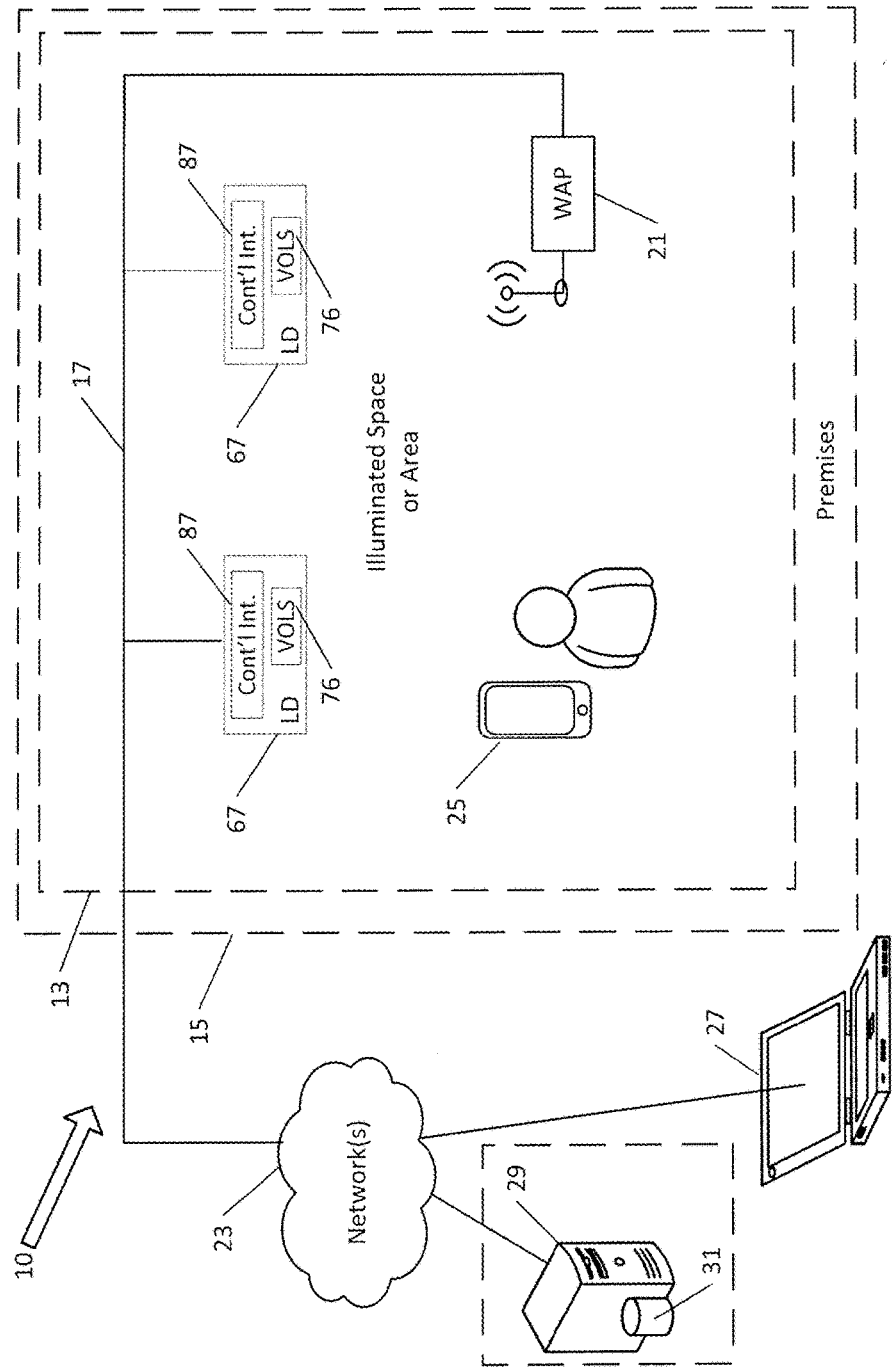
FIG. 6 is a simplified system diagram of a lighting system having lighting devices incorporating variable optic light emitting devices, such as those illustrated in any of FIG. 1A.

FIG. 6 is a simplified system diagram of a lighting system having lighting devices incorporating variable optic light sources, such as those illustrated in any of FIGS. 1-5. FIG. 6 shows a premises 15 having an illuminated space or area 13 in which lighting devices 67 incorporate a variable optic light source (VOLS) 76. The variable optic light source 76 may be a device as described in any of the examples of FIGS. 1-5, and a control interface 87. The control interface 87 (described in more detail with reference to the example of FIG. 7A or 7B) may receive control signals from a controller that are applied without processing via the control interface 87 to the variable optic light source 76 of the lighting devices 67. Alternatively, any control signals received by the control interface 87 may be processed and applied to the variable optic light source 76. For example, the control interface 87 may receive signals for controlling an intensity of the microLEDs of an array, such as 200-400.

The data network 17 in the example also includes a wireless access point (WAP) 21 to support communications of wireless equipment at the premises 15. For example, the WAP 21 and network 17 may enable a user terminal, such as mobile device 25, of a user to control operations, such as the beam shaping and beam steering as described with reference to FIGS. 1-4 of any lighting device 67 at the premises 15. However, the ability to control operations of a lighting device 67 may not be limited to a user terminal accessing data network 17 via WAP 21 or other on-premises access to the network 17. Alternatively, or in addition, a user terminal such as laptop 27 located outside premises 15, for example, may provide control signals to one or more lighting devices 11 via one or more other networks 23 and the on-premises network 17. Network(s) 23 includes, for example, a local area network (LAN), a metropolitan area network (MAN), a wide area network (WAN) or some other private or public network, such as the Internet. Alternatively or in addition, a server, such as server 29, coupled to a database, such as database 31, may control the variable optical assemblies 76 by sending control signals to the control interface 87 of the respective lighting devices 67. The control signals may include electrowetting signals as well as light source control signals. In addition, different control signals may be sent to different lighting devices 67 within the same illuminated space or area 13 to provide customized lighting effects, such as task lighting, that are provided by lighting devices 67 cooperating to provide the desired customized lighting effect. The devices 25, 27 and 29 may act as external controllers that are coupled to the respective control interfaces 87 of the lighting devices 67.

The discussion of the examples of FIGS. 1-5 refer generally to a control interface. An example of an control interface usable with the variable optics and light sources described with reference to the examples of FIGS. 1-5 couples to the contacts of the light sources and/or to the electrodes of the electrowetting structures. More detailed examples of control interfaces are shown in the functional block diagram examples of FIGS. 7A and 7B. FIGS. 7A and 7B illustrate functional block diagram examples of a control interface for use in devices and/or arrays having a light source device incorporating a variable optic assembly, such as those illustrated in any of FIGS. 1-5.

Figure 7A:
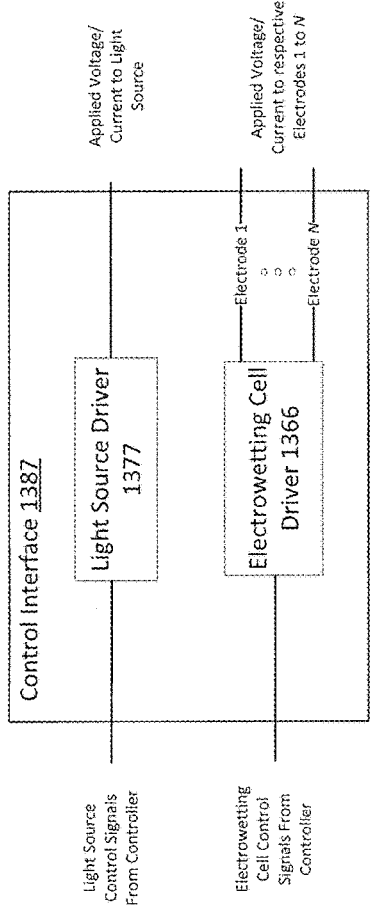
FIGS. 7A and 7B illustrate functional block diagram examples of a control interface for use in lighting devices having a light emitting device incorporating a variable optic assembly or an array of variable optic light emitting devices, such as those illustrated in any of FIGS. 1A-5.

In FIG. 7A, the control interface 1387 may be integrated in lighting devices incorporating variable optics light sources, such as those illustrated in any of FIGS. 1-5. The control interface 1387 includes a light source driver 1377 and an electrowetting structure driver 1366. The control interface 1387 also has inputs to receive light source control signals and electrowetting control signals from a controller, such as 25, 27, or 29 of FIG. 6. The light source driver 1377 may receive light source control signals from a controller and convert the received control signals into a voltage or current that is applied to a light emitting device, such as an microLEDs, such as light emitting device 100 of FIG. 1A, a light emitting array, such as 400 of FIG. 5, or the like. The light source driver 377 may include electronic circuit components analog and/or digital circuitry as well as logic circuits that receive and process the output signals as applied voltages or currents to the light source. The processing may include digital-to-analog conversion, signal buffering, signal conditioning or other signal manipulation that facilitates an output from the light source that corresponds to the received control signal. Alternatively, the light source control signals received from the controller may be passed without processing by the light source driver 1377 directly to the light emitting device or light emitting array as the applied voltage or current.

The electrowetting structure driver 1366 includes an input for receiving the electrowetting control signals delivered to the control interface 1387 and a number of outputs to respective electrodes of the electrowetting structures or electrowetting structure, such as 470 of FIG. 4. The electrowetting structure driver 1366 may receive the electrowetting structure control signals from the controller and convert the received control signals into a voltage or current that is applied to electrodes of a respective electrowetting structure or electrowetting structure. The electrowetting structure driver 1366 may include electronic circuit components both analog and digital circuitry as well as logic circuits, including a multiplexor that receive and process the output signals as applied voltages or currents to the respective electrodes. The processing may include digital-to-analog conversion, signal buffering, signal conditioning or other signal manipulation that facilitates an output from the light source that corresponds to the received control signal.

Figure 7B:
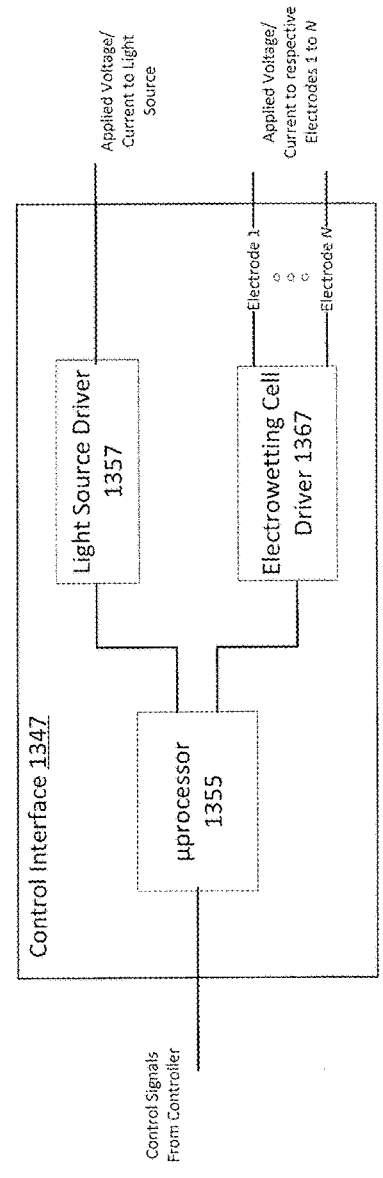

FIG. 7B illustrates another example of a control interface, such as 180 in FIG. 1A The control interface 1347 of FIG. 7B may be integrated in lighting devices incorporating electrowetting structures, such as those illustrated in any of FIGS. 1-5. The control interface 1347, in this example, includes a microprocessor 1355, a light source driver 1357, and an electrowetting structure driver 1367. The microprocessor 1355 may receive control signals from a controller, such as 25, 27, or 29 of FIG. 12. The microprocessor 1355 may determine that the received control signals are intended for either the light emitting device or an electrode of an electrowetting structure. For example, the received control signal may include a signal value that the microprocessor 1355 is able to identify as is known in the art, and based on the identification is able to appropriately process the signal. Based on the determination or identification, the microprocessor 1355 may pass a light control signal to the light source driver 1357. The received light control signal is processed by the light source driver 1357 in a manner similar to that described above with reference to light source driver 1377 of FIG. 7A, and is applied to a light emitting device, such as 100, or light emitting array 400.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A chip-scale device, comprising:
  a light emitting semiconductor that emits light, the light emitting semiconductor being formed on a first substrate;
  a collimating beam structure formed on or from a second substrate, the collimating beam structure coupled to the light emitting semiconductor and configured to collimate a beam of light emitted by the light emitting semiconductor; and
  an electrowetting structure coupled within the collimating beam structure, wherein the electrowetting structure comprises:
    (a) a first fluid having a first index of refraction and that is electrically conductive;
    (b) a second fluid having an index of refraction greater than the first index of refraction of the first fluid;
    (c) a sealing layer that seals the first fluid and the second fluid within the electrowetting structure, wherein light emitted from the light emitting semiconductor passes through the collimating beam structure and the electrowetting structure; and
    (d) electrodes coupled to the first liquid and coupled to a voltage source;
  wherein the second substrate extends longitudinally from a direction of the first substrate.

2. The chip-scale device of claim 1, wherein:
  the first substrate bears the light emitting semiconductor;
  the second substrate is attached to the first substrate; and
  the collimating beam structure is etched from the second substrate.

3. The chip-scale device of claim 1, further comprising:
  a reflective material inserted along a surface of the collimating beam structure, wherein the reflective material further collimates light output by the light emitting semiconductor.

4. The chip-scale device of claim 3, wherein the reflective material is a conductive metal usable as one or more of the electrodes coupled to the first liquid.

5. The chip-scale device of claim 1, wherein:
  the first substrate and the second substrate are wafer bonded together to form a single substrate structure incorporating the light emitting semiconductor, the collimating beam structure, and the electrowetting structure.

6. The chip-scale device of claim 1, wherein:
  the first substrate and the second substrate are elements of an integrated single piece of substrate, and
  the light emitting semiconductor is fabricated on the first substrate prior to the etching of the collimating beam structure of the second substrate.

7. The chip-scale device of claim 1, wherein the electrodes further comprises:
  a layer of electrodes formed on the substrate wall electrically coupled with the first fluid, configured for connection to a selectively variable voltage source to control a geometry of a meniscus between the first and second fluids.

8. A light emitting array, comprising:
  a plurality of chip-scale light source devices arranged in a group, wherein each of the plurality of chip-scale light source devices in the group includes:
    a lighting emitting semiconductor;
    a collimating beam structure; and
    an individually, controllable electrowetting structure, wherein the lighting emitting semiconductor, collimating beam structure, and controllable electrowetting structure in each light source device are centered about a central axis of the light source device, wherein:
      each light emitting semiconductor is formed on a first substrate;
      each collimating beam structure is:
        configured to collimate a beam of light emitted by a corresponding one of the plurality of light emitting semiconductors, and
        formed on or from a second substrate that extends longitudinally from a direction of the first substrate; and
      each electrowetting structure is configured to vary light emitted by an light emitting semiconductor aligned with the electrowetting structure.

9. The lighting array of claim 8, the collimating beam structure of each chip-scale light source device further comprising:
  an interior space within exterior walls, wherein the electrowetting structure is disposed within the interior space of the collimating beam structure of each light source device.

10. The lighting array of claim 8, wherein each electrowetting structure comprises:
   (a) a first fluid having a first index of refraction and that is electrically conductive;
   (b) a second fluid having an index of refraction greater than the first index of refraction of the first fluid;
   (c) a sealing layer that seals the first fluid and the second fluid within the electrowetting structure, wherein light emitted from the light emitting semiconductor passes through the collimating beam structure and the electrowetting structure; and
   (d) electrodes coupled to the first liquid and coupled to a voltage source.

11. The array of claim 8, wherein the first substrate of each light emitting semiconductor is separate from first substrates of the other light emitting semiconductors of individual light source devices of the plurality of light source devices.

12. The chip-scale device of claim 1, wherein the second substrate encloses the electrowetting structure.

13. The chip-scale device of claim 1, wherein the second substrate extends longitudinally upwards from the first substrate.

14. The lighting array of claim 8, wherein the second substrate encloses the electrowetting structure.

15. The lighting array of claim 8, wherein the second substrate extends longitudinally upwards from the first substrate.

* * * * *